United States Patent
Joh et al.

(10) Patent No.: US 9,476,933 B2
(45) Date of Patent: Oct. 25, 2016

(54) APPARATUS AND METHODS FOR QUALIFYING HEMT FET DEVICES

(71) Applicant: Texas Instruments Incorporated, Dallas, TX (US)

(72) Inventors: Jungwoo Joh, Allen, TX (US); Srikanth Krishnan, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 164 days.

(21) Appl. No.: 14/547,849

(22) Filed: Nov. 19, 2014

(65) Prior Publication Data

US 2015/0160285 A1 Jun. 11, 2015

Related U.S. Application Data

(60) Provisional application No. 61/913,760, filed on Dec. 9, 2013.

(51) Int. Cl.
| | |
|---|---|
| *G01R 31/02* | (2006.01) |
| *G01R 31/26* | (2014.01) |
| *H01L 29/778* | (2006.01) |
| *H01L 29/20* | (2006.01) |

(52) U.S. Cl.
CPC ....... *G01R 31/2621* (2013.01); *H01L 29/2003* (2013.01); *H01L 29/7787* (2013.01)

(58) Field of Classification Search
CPC .............. G01R 31/3004; G01R 31/318513; G01R 31/31924; G01R 1/0491; G01R 31/265; G01R 31/3012; G01R 31/31851; G01R 31/2608; G01R 31/261; G01R 31/2612; G01R 31/2614; G01R 31/2616; G01R 31/2617; G01R 31/2619

See application file for complete search history.

(56) References Cited

U.S. PATENT DOCUMENTS

| | | | |
|---|---|---|---|
| 3,930,809 A | 1/1976 | Evans | |
| 6,812,730 B2 * | 11/2004 | Pan | G01R 31/2621 324/762.09 |
| 7,968,913 B2 | 6/2011 | Hopper et al. | |

(Continued)

OTHER PUBLICATIONS

Jungwoo Joh, Naveen Tipirneni, Sameer Pendharkar, Srikanth Krishnan, "Current Collapse in GaN Heterojunction Field Effect Transistors for High-voltage Switching Applications," Reliability Physics Symposium, 2014 IEEE International, pp. 6C.5.1-6C.5.4, IEEE, copy attached.

(Continued)

*Primary Examiner* — Tung X Nguyen
(74) *Attorney, Agent, or Firm* — Jacqueline J. Garner; Frank D. Cimino

(57) ABSTRACT

A method includes coupling a gate pulse generator to a gate terminal of a power transistor device under test, coupling a drain pulse generator to a drain terminal of the power transistor device under test; for a first set of test conditions, activating the drain pulse generator for each of the test conditions to apply a voltage pulse to the drain terminal, and for each of the test conditions, applying a voltage pulse to the gate terminal, the gate pulse rising only after the drain pulse falls below a predetermined threshold; for a second set of test conditions, applying a voltage pulse to the drain terminal, and applying a voltage pulse to the gate terminal, the drain pulse generator and the gate pulse generator both being active so that there is some overlap; and measuring the drain current into the power transistor device under test. An apparatus is disclosed.

20 Claims, 7 Drawing Sheets

(56) References Cited

U.S. PATENT DOCUMENTS 8,362,785 B2 * 1/2013 Tamegaya .......... G01R 31/2644
257/48
8,593,211 B2 11/2013 Forghani-Zadeh et al.
2012/0274402 A1 11/2012 Kocon

OTHER PUBLICATIONS

Raymond S. Pengelly, Simon M. Wood, James W. Milligan, Scott T. Sheppard, William L. Pribble, "A Review of GaN on SiC High Electron-Mobility Power Transistors and MMICs," IEEE Transactions on Microwave Theory and Techniques, vol. 60, No. 6, Jun. 2012, pp. 1764-1783, IEEE, copy attached.

Texas Instruments, Inc., "Gate Drivers for Enhancement Mode GaN Power FETs," www.ti.com, SLYB189, 2012, retrieved from world wide web, uniform resource locator: http://www.ti.com/lit/ml/slyb189/slyb189.pdf, on Nov. 19, 2014, copy attached.

Wikipedia, "High-electron-mobility transistor," retrieved from world wide web, uniform resource locator: http://en.wikipedia.org/wiki/High-electron-mobility_transistor on Nov. 19, 2014, copy attached.

Silvaco, "Current Collapse Phenomenon in GaN HFETs resulting from Intentional Bulk Iron (Fe) Doping and Un-Intentional Interface Traps," www.silvaco.com, The Simulation Standard, Apr., May, Jun. 2012, retrieved from world wide web, uniform resource locator: http://www.silvaco.com/tech_lib_TCAD/simulationstandard/2012/apr_may_jun/a4/Current_Collapse_Phenomenon_in_GaN_HFETs_resulting_from_Intentional_Bulk_Iron_Fe_Doping_and_Un-intentional_Interface_Traps_a4.html on Nov. 19, 2014, copy attached.

* cited by examiner

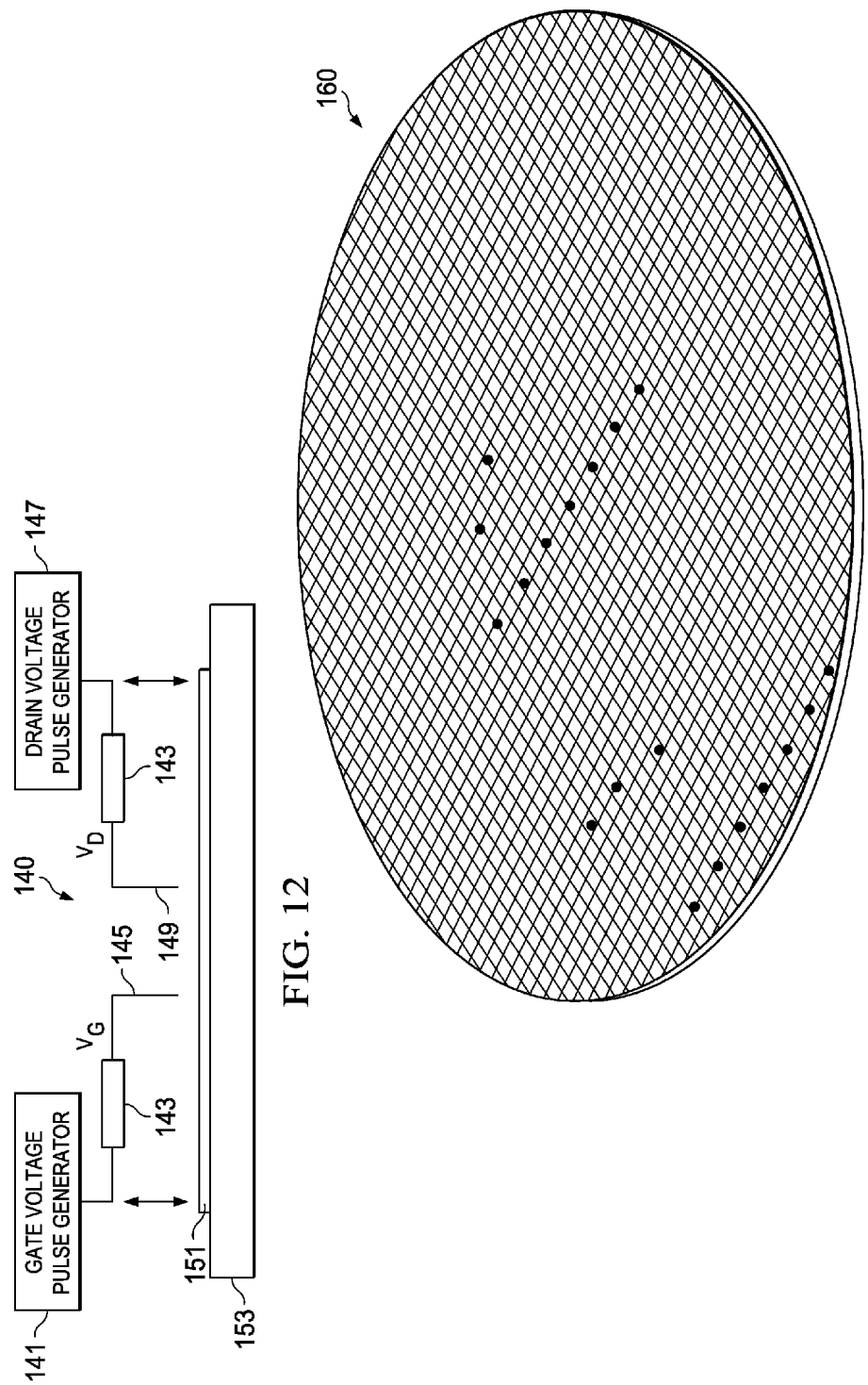

APPARATUS AND METHODS FOR QUALIFYING HEMT FET DEVICES

RELATED APPLICATIONS

This patent application claims priority to U.S. Provisional Application Ser. No. 61/913,760, entitled "GAN FET Qualification with Double Pulser System," filed Dec. 9, 2013, which is hereby incorporated by reference herein in its entirety.

TECHNICAL FIELD

Aspects of the present application relate generally to the use of high electron mobility transistors (HEMTs) such as FET devices. Recently gallium arsenide (GaAs) and gallium nitride (GaN) field effect transistor (FET) devices are used for HEMTs which include a heterojunction in a channel area, and in particular the present application has aspects directed to the qualification of HEMT FET devices

BACKGROUND

The use of GaAs and GaN HFET devices is increasing because these devices provide high current and high voltage handling capabilities, and thus, these devices are of particular importance in applications that require high power. GaAs and GaN FET type HEMT devices provide high performance over prior known silicon MOSFET devices and this is particularly true in power applications. For example, GaN FET devices have much lower Figure of Merit (FOM) characteristics over silicon MOS devices due to a lower resistance from drain to source when active (Rdson) and lower gate charge (Qg). However, HEMT transistors such as GaN FETs have complex hole and electron trapping characteristics and exhibit current collapse behaviors which, to date, have made test, evaluation and qualification of HEMT and HFET devices difficult, time consuming, and expensive.

The high power capabilities are due to the particular physical characteristics for these devices which have a heterojunction formed in the channel region. For example, for GaN FET devices, the GaN material provides a high breakdown field. Further, the AlGaN/GaN interface provides a high sheet carrier density.

However, unlike conventional silicon MOS devices, GaAS and GaN HFET devices have complex physical characteristics that require additional testing to quantify the performance and thereby qualify FET devices for production. HFET devices exhibit carrier trapping behaviors and high voltage current collapse behaviors that need to be measured for devices in order to qualify production devices for use. These mechanisms are further described, for example, in a paper entitled "Current Collapse in GaN Heterojunction Field Effect Transistors for High-voltage Switching Applications," presented at the 2014 IEEE International Reliability Physics Symposium (IRPS), Jun. 1-5, 2014, at Waikoloa, Hi., which is hereby incorporated by reference herein in its entirety.

The measurements needed to qualify HFETs are made under a variety of load conditions that, in the prior known solutions, require dedicated circuit boards used in a dedicated custom test environment, adding cost and additional time to the testing process. Further the tests in the prior known solutions are performed on packaged integrated circuit devices. Devices that fail to qualify for use can result in unused silicon and further, wasted package materials including solder balls, wires, mold compound, epoxies and the like.

FIG. 1 depicts, in a cross sectional view, a portion of a prior known as GaN HFET. In FIG. 1, silicon or other semiconductor material substrate 11 is provided. The semiconductor substrate can be of various materials including, for example but without limitation, SiC and sapphire. A buffer layer 13 is provided overlying the substrate. An undoped gallium nitride layer 15 is formed over the buffer layer, for example using epitaxial deposition techniques. An aluminum gallium nitride layer 19 is deposited over the gallium nitride layer 15. In this insulated gate example, a gate dielectric 21 is formed over the aluminum gallium nitride layer; this gate dielectric may be, for example, a silicon nitride layer. A gate conductor 29 is formed over the gate dielectric 29. Source and drain conductors 25 and 23 are formed and contact source and drain regions beneath the conductors in the AlGaN layer. Passivation material 31, 33 overlies and protects the gate dielectric 21, and insulates the conductive source, drain and gate terminals one from another. Because a heterojunction is formed in the channel region beneath the gate electrode, the FET 10 is referred to as an "HFET".

In operation, the channel for the HFET transistor formed by the gate, source and drain regions has highly mobile electrons in a two dimensional electron gas region formed in a shallow region at the interface between the AlGaN and GaN regions, 17. This region is sometimes referred to as a "2DEG" region.

FIG. 2 depicts a simple circuit symbol for the GaN HFET 10 in FIG. 1. These devices are high power capable FET devices and are useful in application such as bridge circuits and power supply circuits and in forming power amplifiers, for example. In addition the devices are useful at high frequencies and applications include monolithic microwave ICs (MMICs) and microwave and radio frequency circuits.

The HFET transistor 10 in FIG. 2 has a gate, a drain and a source terminal. In testing the HFET devices, complex testing is required due to the current collapse phenomenon. Under certain conditions, the drain current flowing through the HFET device will fall. This current collapse behavior occurs due to carrier trapping mechanisms in the devices that differ from the doped source and drain and the channel operation of conventional silicon MOSFET devices, for example. As a result, a variety of measurements are needed to characterize HFET transistors. Tests are needed to observe the transistors in operation for a variety of different load situations.

FIG. 3 depicts in a graph the drain current vs. drain to source voltage, or "I-V" curves, for a variety of gate voltage $V_G$ lines for a typical HFET device. In FIG. 3, a soft switching situation is shown by the line labeled "soft switching". In soft switching, a gate voltage pulse is applied to an HFET device with little or no voltage at the drain ($V_D$). When an HFET is switched on by a gate pulse with little voltage at the drain terminal, current collapse can occur, that is, the drain current $I_D$ can be low or zero even if the HFET device is turned on. In another load situation, known as hard switching, the HFET device can turn on due to a large rise in the gate voltage $V_G$ over a threshold voltage while a large voltage is present at the drain ($V_D$). This is indicated in the I-V curves by a line labeled "hard switching". Finally in another load situation, a resistive load switching can occur, indicated by the line labeled "Resistive load switching," where the HFET remains in a linear mode, not a saturation mode, and acts as a resistive element, so that the drain current $I_D$ falls as the voltage Vds increases (linear resistor).

In a transistor production environment, these HFET devices are tested to qualify the devices for use. To confirm that the finished HFET devices will operate within a certain specified range, the devices can be tested under a range of switching conditions. In the prior known testing solutions, custom circuit boards for controlling the gate and drain voltages were fabricated for the purpose of qualifying the HFET devices. This prior known approach adds expense and testing time to the production process that is greater than normally expended for FET devices. Further, in the prior known approaches the testing to date is done on packaged integrated circuit devices. When a device fails to pass the qualification testing, it is scrapped, and the packaging materials and effort expended in packaging the failed devices can be lost, increasing production costs and wasting mold compound, bond wires, solder bumps, and the like.

Improvements in the methods and apparatus used for qualifying HFET devices such as GaN FETs, for example, are therefore needed to address the deficiencies and the disadvantages of the prior known approaches. Solutions are needed that quickly perform the complex load testing required to qualify these devices at a minimum cost and with no or little custom hardware required.

SUMMARY

Various aspects of the present application provide improved methods and apparatus for qualification testing for HEMT and HFET devices. Novel test methods are provided which include dual pulse generators coupled to wafer probes for placing a variety of pulses at the gate and drain terminals of an HFET under test at the wafer stage. In aspects of the present application including various novel methods, a set of tests are performed with non-overlapping voltage pulses produced and applied to the drain, and gate, terminals for a variety of conditions, and a second set of tests are performed where voltage pulses are applied to the gate and drain terminals with a range of overlap times. In the tests performed, the current flowing through the drain to source conduction path of the GaN FET is observed.

In one aspect of the present application a test method includes coupling a gate pulse generator to a gate terminal of a power transistor device under test, coupling a drain pulse generator to a drain terminal of the power transistor device under test, and coupling a source terminal of the power transistor device under test to a ground potential; coupling a current monitor to the drain terminal of the power transistor device under test; for a first set of test conditions, activating the drain pulse generator for each of the test conditions to apply a voltage pulse to the drain terminal of the power transistor device under test, and for each of the test conditions, applying a voltage pulse to the gate terminal of the power transistor device from the gate pulse generator, the gate pulse rising only after the drain pulse falls below a predetermined threshold for each test condition; for each of the first set of test conditions, measuring the drain current of the power transistor device under test with the drain current monitor; for a second set of test conditions, activating the drain pulse generator and applying a voltage pulse to the drain terminal of the power transistor device under test, and applying a voltage pulse to the gate terminal of the power transistor device under test as the drain pulse falls for each cycle, the drain pulse generator and the gate pulse generator both being active at the same time for a portion of the second set of test conditions so that there is some overlap between the voltage pulse applied to the drain terminal and the voltage pulse applied to the gate terminal; and for each of the second set of test conditions, measuring the drain current into the power transistor device under test with the drain current monitor.

In another aspect of the present application, a method for manufacturing power FET devices includes: providing a semiconductor wafer comprising a plurality of integrated circuits formed thereon, each of the integrated circuits having at least one power FET device comprising a high electron mobility transistor (HEMT) having a gate, a drain and a source terminal; providing a probe card having conductive probes configured to electrically contact the gate, drain and source terminals of the at least one power FET device on one or more of the integrated circuits on the semiconductor wafer, and placing the probe card proximate to and in alignment with the semiconductor wafer; moving at least one of the semiconductor wafer and the probe card to establish electrical contact between ends of the conductive probes and the semiconductor wafer; coupling a gate pulse generator to a probe that is in electrical contact with a gate terminal of the power FET device on the semiconductor wafer, coupling a drain pulse generator to a probe that is in electrical contact with the drain terminal of the power FET device and coupling a ground potential to a probe that is in electrical contact with the source terminal of the power FET device; for a first set of soft switching conditions, activating the drain pulse generator for each of a plurality of test conditions and applying a voltage pulse to the drain terminal of the power FET, and for each of the plurality of test conditions, activating the gate pulse generator and applying a voltage pulse to the gate terminal of the power FET, the gate pulse rising only after the drain pulse falls to a predetermined low voltage for each test condition so the gate and drain voltage pulses never overlap; for each of the first set of test conditions, measuring the drain current of the power FET with a drain current monitor; for a second set of test conditions, activating the drain pulse generator and applying a voltage pulse to the drain terminal of the power FET, and activating the gate pulse generator and applying a voltage pulse to the gate terminal of the power FET as the drain pulse falls for each of the test conditions, the drain pulse generator and the gate pulse generator both being active at the same time for a portion of each of the test conditions, so that there is some overlap between the voltage pulse applied to the drain terminal and the voltage pulse applied to the gate terminal; and for each of the second set of test conditions, measuring the drain current into the GaN FET with the drain current monitor.

In yet another aspect of the present application, in the above method, wherein each of the power FET transistors further comprises one selected from the group consisting essentially of a gallium nitride heterojunction FET transistor and a gallium arsenide heterojunction FET transistor. In a further additional aspect of the present application, the above methods are performed and include storing the drain current measurements for the first set of test conditions, and storing the drain current measurements for the second set of test conditions; and comparing the stored drain current measurements to a set of predicted drain current measurements, and determining whether the measured drain current is within a predetermined threshold of the predicted drain currents.

In still another aspect of the present application, the above methods further include indicating a power FET on the semiconductor wafer is a qualified device, responsive to the determining. In yet an additional aspect of the present application, the above methods further include indicating a power FET on the semiconductor wafer is not a qualified device and marking the corresponding integrated circuit die on the semiconductor wafer with a machine visible marking.

In another aspect of the present application, the above methods are performed and include singulating the semiconductor wafer into separated integrated circuit dies, and packaging the separated integrated circuit dies that are unmarked.

In another aspect of the present application, an apparatus includes a first pulse generator configured to generate gate terminal pulses for testing a power FET device under test; a second pulse generator configured to generate drain terminal pulses for testing the power FET device under test; a drain current monitor for measuring the drain current of the power FET device under test; and a controller coupled to the first pulse generator and the second pulse generator for enabling a gate voltage pulse from the first pulse generator and a drain voltage pulse from the second pulse generator; wherein the controller is configured to perform a first set of test conditions corresponding to a soft switching condition where for each test in the first set of test conditions, a drain voltage pulse is output from the second pulse generator, and as the drain pulse falls below a predetermined voltage, a gate voltage pulse is output from the first pulse generator, so that the drain voltage pulse and the gate voltage pulse never overlap, and the controller is further configured to perform a set of second test conditions corresponding to a hard switching condition where, for each test in the second set of test conditions, a drain voltage pulse is output from the second pulse generator, and a gate voltage is output from the first pulse generator as the drain pulse falls, to that for a portion of each test in the second set of test conditions, the gate voltage pulse and the drain voltage pulse overlap.

In yet another aspect of the present application, the above described apparatus is provided and further includes a wafer probe card having at least one gate probe coupled to the first pulse generator and configured to supply the gate voltage pulses to a gate terminal of a power FET device disposed on a semiconductor wafer, and having at least one drain probe coupled to the second pulse generator and configured to supply the drain voltage pulses to the drain terminal of a power FET device disposed on a semiconductor wafer, and having at least one source probe configured to supply a ground potential to the power FET device disposed on the semiconductor wafer.

Recognition is made in aspects of this application of solutions for providing a novel test methodology for HFET devices that reduces time and costs for qualifying HFET devices. In the novel test methodology, dual pulse sources are used to create a variety of load conditions for qualifying the HFET devices over a range of operating modes. The novel test methodologies disclosed further enable the use of wafer scale testing and known good die approaches to eliminate the waste that occurred using the prior known solutions, which tested packaged devices.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 12 illustrates in a block diagram an apparatus for use with certain aspects of the present application; and FIG. 13 depicts a semiconductor wafer with die markings obtained using certain features of the present application.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, or the scope of the appended claims.

For example, when the term "coupled" is used herein to describe the relationships between elements, the term as used in the specification and the appended claims is to be interpreted broadly, and is not to be limited to "connected" or "directly connected" but instead the term "coupled" may include connections made with intervening elements, and additional elements and various connections may be used between any elements that are "coupled."

In various aspects of the present application, novel solutions are provided for testing and qualifying production HFET devices. In certain aspects of the present application, dual voltage pulse generators are used. A first voltage pulse generator is coupled to the gate terminal of an HFET device. A second voltage pulse generator is coupled to the drain terminal of the HFET device. A current monitor is coupled to the drain terminal, while the source terminal is couple to ground.

In an aspect of the present application, a first set of tests is performed for various load conditions using a voltage pulse at the drain terminal, and as the voltage pulse at the drain terminal falls, a voltage pulse is applied to the gate terminal to turn on the HFET device. The drain current is monitored for a variety of gate voltages to provide a plurality of load lines. In the first set of tests, the voltage pulses are non-overlapping. That is, the gate voltage pulse does not begin to rise until after the drain voltage pulse falls. This first set of tests evaluates the HFET in a "soft switching" condition.

In a further aspect of the present application, a second set of tests is performed. In this second set of tests, a pulse is generated at the drain terminal and a pulse is generated at the gate terminal, as the pulse at the drain terminal falls, the pulse at the gate terminal rises. In the second set of tests, the pulses have a variety of overlap times. That is, the pulse at the gate terminal rises while a voltage is still present at the drain terminal. This second set of tests evaluates the HFET in a "hard switching" condition. Note that in alternative arrangements, the first and second set of tests can be performed in the opposite order, that is, the order is not significant for the operation of the arrangements.

Figure 1:
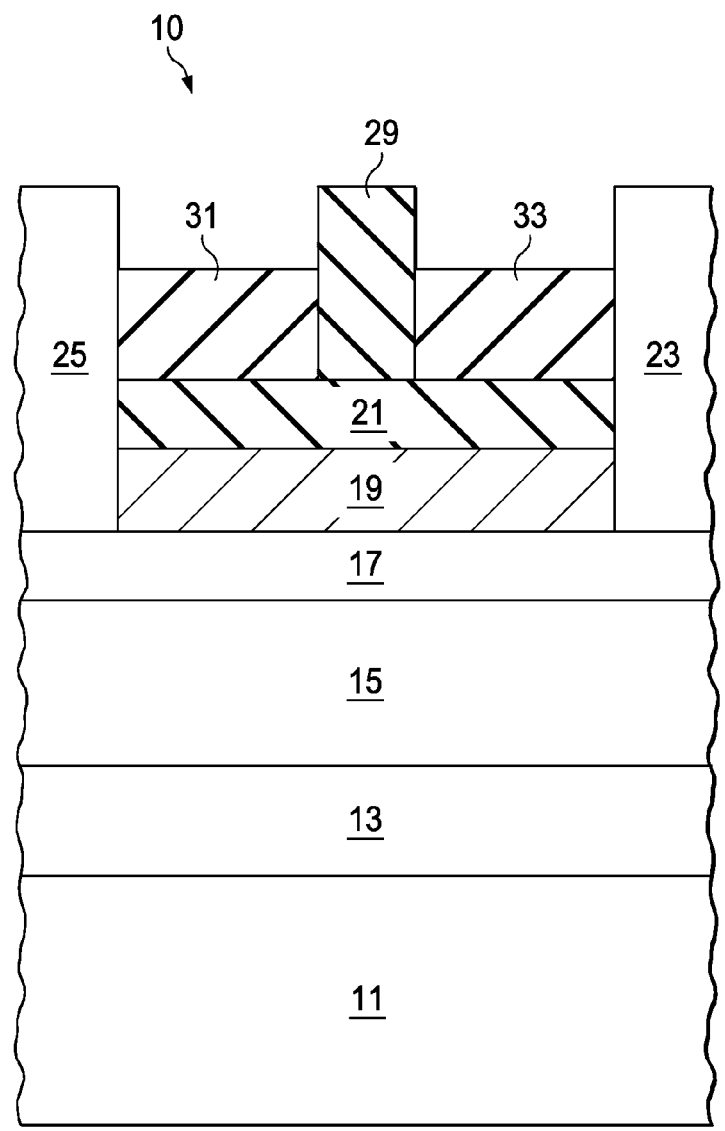
FIG. 1 illustrates in a simplified diagram a cross sectional view of a FET device incorporating a heterojunction in the channel illustrated for describing various aspects of the present application.
Figure 2:
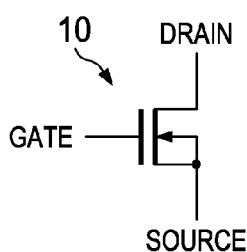
FIG. 2 illustrates in simplified circuit diagram an HFET device for describing certain aspects of the application.
Figure 3:
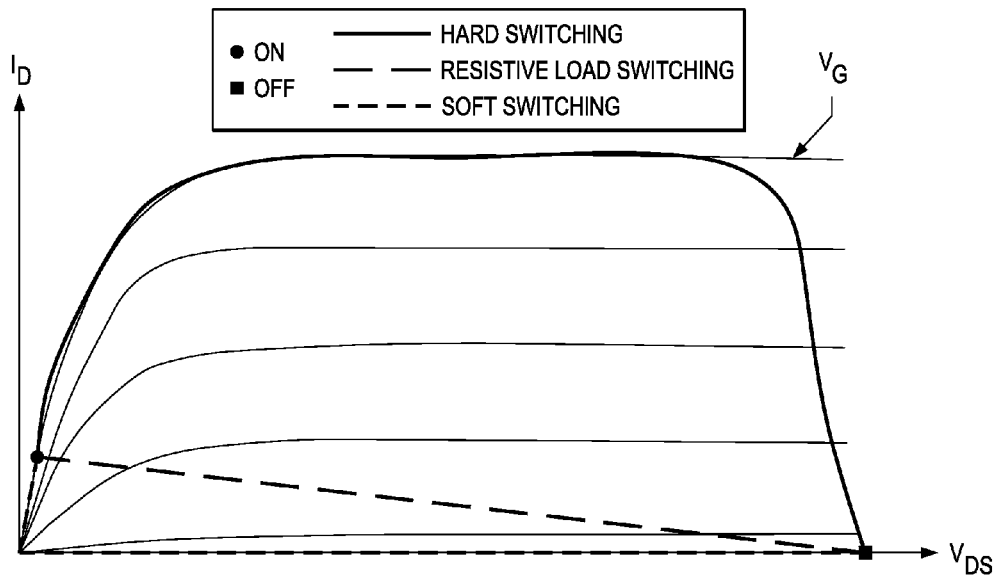
FIG. 3 illustrates in a simplified graph a plot of drain current vs. source to drain voltage for an HFET device.
Figure 4:
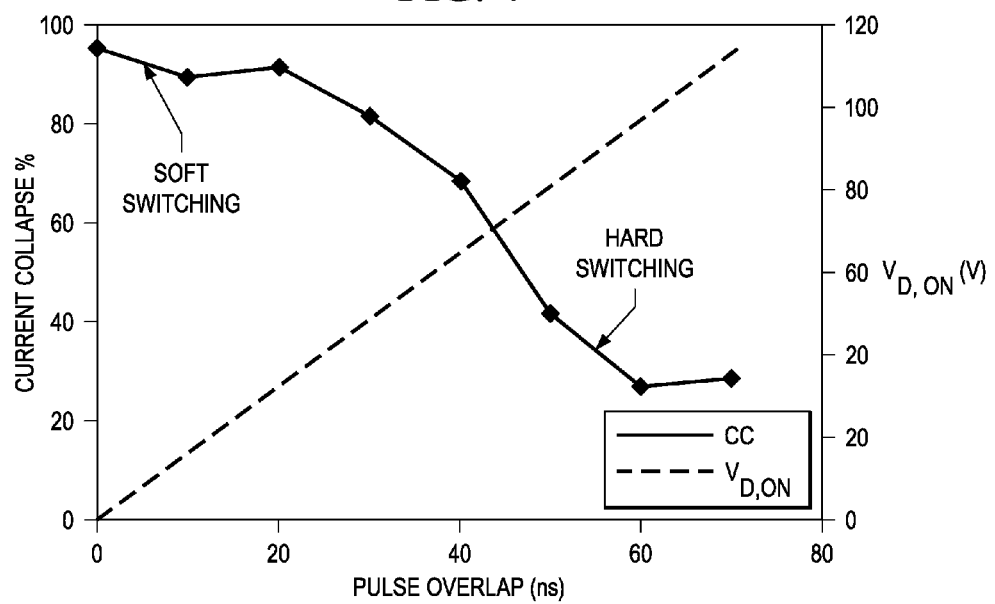
FIG. 4 illustrates in a simplified graph the current collapse phenomenon of an HFET device such as can be used with certain aspects of the present application.

FIG. 4 illustrates, in a graph plotting voltage, current and the amount of pulse overlap between the gate voltage Vg and the drain voltage Vd (shown in nanoseconds), the current collapse phenomenon observed for an example HFET device, in this non-limiting example, a GaN HFET device.

In FIG. 4, the label "CC" indicates the line that plots current collapse measured for various conditions, from conditions where there is little or no overlap to conditions with 80 nanoseconds overlap between the voltage pulses.

In FIG. 4, at the left axis, a data point is shown with approximately 100% current collapse, with an arrow pointing from the label "Soft Switching." As shown on the horizontal axis labeled "Pulse Overlap," this data point was taken with a zero nanoseconds pulse overlap between the gate terminal voltage pulse and the drain terminal voltage pulse. This data point illustrates the current collapse that can occur in the "soft switching" operation where the voltage on the drain terminal falls prior to the arrival of the pulse voltage on the gate terminal of the HFET.

In FIG. 4, another data point taken with 60 nanoseconds of overlap indicates the current collapse observed labeled as a "hard switching" example. At the pulse overlap of 60 nanoseconds, the current collapse is shown as around 35%. The operation of the HFET is thus quite different depending on whether the device is turned on (by a rising gate voltage that exceeds a threshold voltage Vt for the FET device) in "soft switching" or in "hard switching" conditions. The amount of current collapse observed is correlated to the length of time the two voltage pulses overlap, as shown in FIG. 4.

In FIG. 4, a diagonal line labeled "Vd, on" indicates the voltage at the drain Vd, for the transistor when it is completely turned on, that is, the diagonal line plots voltage from drain to source during an on condition, i.e., "VDSon" for the transistor.

Figure 5:
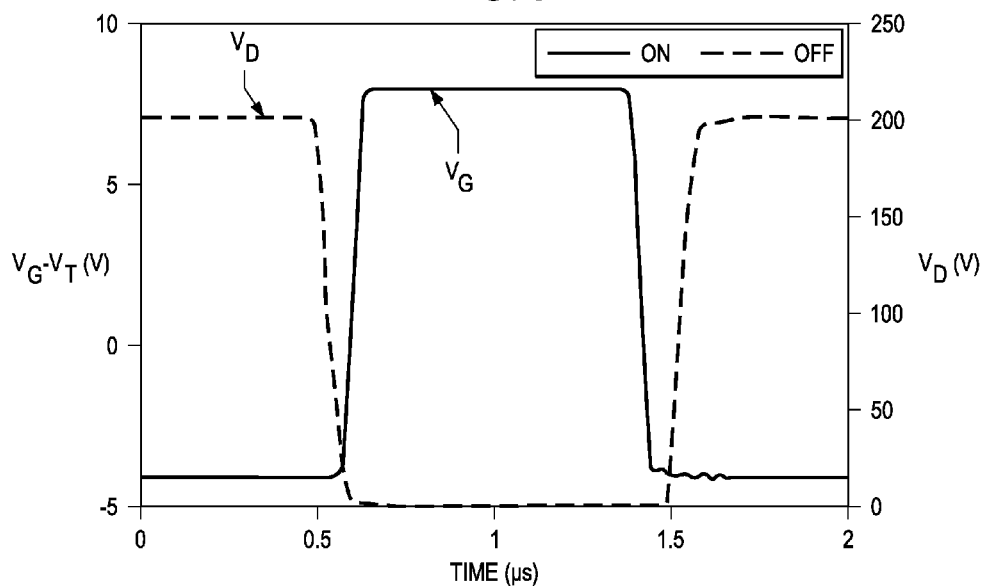
FIG. 5 illustrates in a timing diagram voltage pulses used in certain features of the present application.

FIG. 5 illustrates in a graph a set of pulses used for a first set of test conditions in one aspect of the present application, test conditions useful for observing the "soft switching" condition for an illustrative example GaN HFET. The line labeled "$V_D$" indicates the voltage waveform at the drain terminal of the HFET. The line labeled "$V_G$" indicates the voltage waveform at the gate terminal of the HFET. In FIG. 5, during the time between 0 and 0.5 microseconds (in the graph, time is plotted on the horizontal axis) the HFET is "OFF" as the gate voltage $V_G$ is below a threshold voltage Vt. During this same time period, a voltage pulse generator coupled to the drain terminal places a high voltage, shown here as 200 Volts, on the drain terminal of the HFET. At time 0.5 microseconds in the graph of FIG. 5, the voltage pulse generator coupled to the drain begins transitioning drain voltage $V_D$ to a low voltage, at time 0.6 microseconds $V_D$ reaches a low voltage of about 0 Volts. At about the same time, the gate voltage $V_G$ generated from a second voltage pulse generator in certain aspects of the present application begins to rise and at a time just greater than 0.6 microseconds in this example, the gate voltage $V_G$-$V_T$ increases to about 7 Volts. This rise in the gate voltage turns the HFET "ON". At time 1.5 microseconds, the pulse at the gate terminal $V_G$ falls, and at about the same time the voltage pulse generator coupled to the drain voltage again raises the voltage $V_D$ to 200 Volts at a time just after time 1.5 microseconds.

In FIG. 5, the gate voltage pulse labeled $V_G$ never overlaps the drain voltage pulse shown as $V_D$. That is, the gate voltage $V_G$ is never at a high value sufficient to turn the HFET device on at the same time there is a positive voltage on the drain terminal $V_D$.

Figure 6:
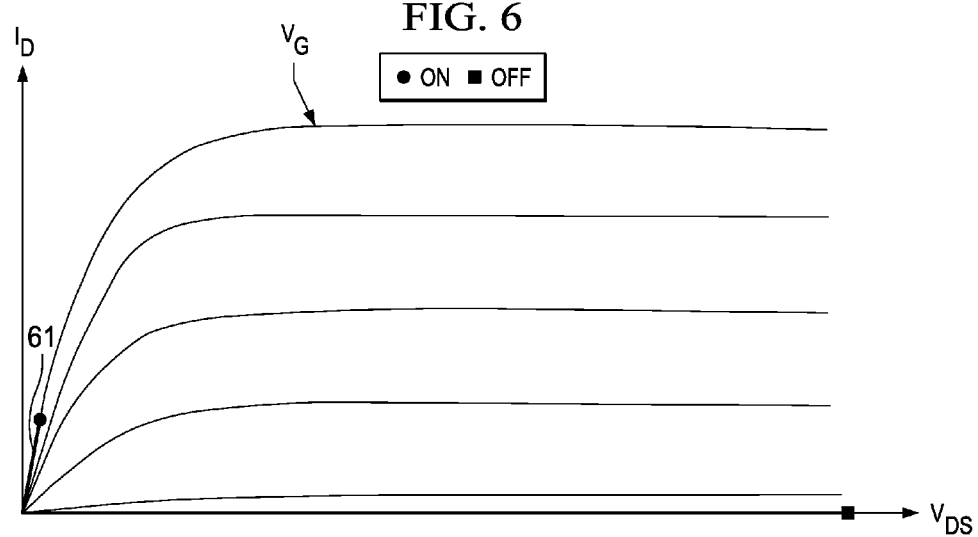
FIG. 6 illustrates in a graph drain current vs. drain to source voltage for an HFET device for use with certain aspects of the present application.

FIG. 6 illustrates in a graph of the drain current vs. the drain to source voltage, $I_D$ v. $V_{DS}$, the drain current $I_D$ obtained for the conditions on the gate and drain terminals of an HFET as shown in FIG. 5. In FIG. 6, the line numbered 61 shows the loadline in a "soft switching" operating condition. When the gate voltage $V_G$-$V_T$ is increased from a zero or cutoff voltage to a voltage greater than a threshold, turning on the HFET, $V_D$ is already at a low voltage, and thus the drain current $I_D$ remains at 0 (the horizontal axis) during the switching event. The lines labeled "$V_G$" show typical I-V curves for the device illustrated as a reference.

Figure 7:
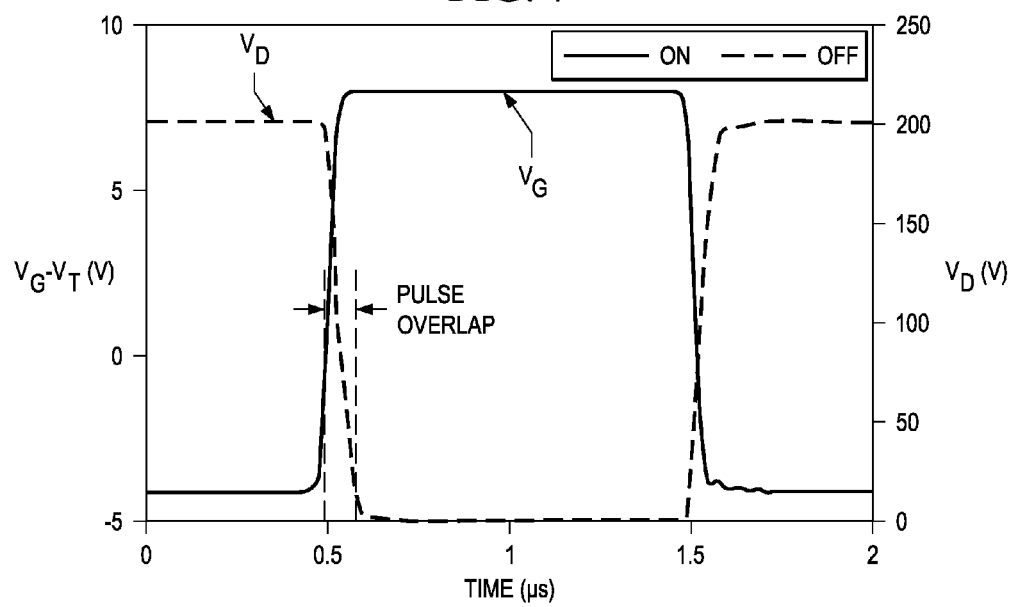
FIG. 7 illustrates in another timing diagram voltage pulses used incorporating additional aspects of the present application.

In FIG. 7 voltage pulses used to perform another set of test conditions that form an additional aspect of the invention are shown. In FIG. 7, in order to test an HFET in a "hard switching" condition, the drain pulse voltage $V_D$ and the gate pulse voltage $V_G$ overlap one another. The HFET therefore turns on with a high voltage $V_D$ at the drain terminal. In FIG. 7, at time 0, (In FIG. 7, time is plotted on the horizontal axis, with $V_G$ on the vertical left side axis and $V_D$ on the right side vertical axis), the HFET under test is OFF because the gate voltage $V_G$-$V_T$ is low, approximately −4 Volts as shown, and the voltage $V_D$ is high, at approximately 200 Volts as seen on the vertical axis on the right side of the graph. At time 0.5, the gate voltage $V_G$-$V_T$ begins rising as a voltage pulse is applied to the gate terminal. During this time, as shown in FIG. 7, the voltage pulse on the gate terminal, and the voltage pulse on the drain terminal, overlap. The voltage on the drain terminal $V_D$ then falls to approximately 0 volts (as seen on the right side vertical axis of FIG. 7) at time 0.6 microseconds, and the gate voltage rises, in this example, to about 7 volts, turning the HFET device completely ON. At time 1.5 microseconds, the voltage pulse applied to the gate terminal $V_G$-$V_T$ falls back to about −4 Volts, and about at the same time the voltage on the drain terminal $V_D$ rises to about 200 Volts. Again there is some overlap. Thus the HFET transistor with these voltage pulses placed at the gate and drain is turned on with a high voltage present at the drain $V_D$, and when it is turning off as the gate voltage pulse on $V_G$ falls, the voltage pulse at the drain $V_D$ rises again to 200 Volts. In various arrangements that form additional aspects of the present application, the overlap can be varied to be longer and shorter and the drain current obtained for a variety of conditions can be observed, each set of conditions forming a test.

Figure 8:
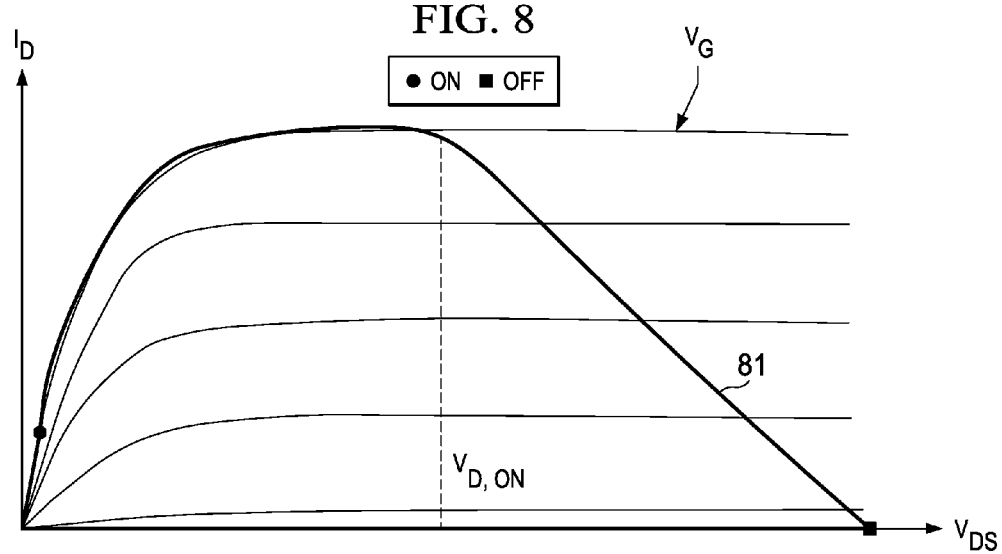
FIG. 8 illustrates a graph of drain current vs. drain to source voltage for an HFET device for use with certain aspects of the present application.

FIG. 8 depicts in an I-V curve graph the hard switching operation of an HFET device when voltages with some overlap such as those illustrated in FIG. 7 are applied. In FIG. 8, as shown by the line numbered 81, when the HFET device turns on, the current $I_D$ increases until the device reaches saturation, and as shown, the device fully turns on with high VDS. Again, lines labeled Vg are shown illustrating typical I-V curves for the device at different gate voltages, as a reference.

In order to qualify an HFET device such as a GaN or GaAs HFET, in aspects of the present application, novel tests are run in both the "soft switching" and "hard switching" conditions to quantify the current collapse, soft switching, and hard switching behaviors. If a device under test has drain current $I_D$ that falls within an expected range +/- an acceptable tolerance value, then the HFET device can be identified as meeting a specification for the device, and this HFET device would then be qualified for use. If another HFET under test had drain current $I_D$ that was different than the expected drain current in either the soft switching, or the hard switching conditions, and the measured performance was not within an acceptable range +/- some tolerance, then that HFET device would not be qualified for use, and would fail qualification.

In an aspect of the present invention, a test methodology uses dual voltage pulse sources controlled to perform both the soft switching and the hard switching tests for a variety of loadline conditions. Note that while the novel test methodology discovered by the inventors is described below as performing the soft switching test condition first, this is an arbitrary decision, and in an alternative test methodology that is also an aspect of the present application that is contemplated by the inventors, the hard switching test condition can be performed first. The novel features are that the HFET qualification tests can be performed simply and without the need for custom boards or dedicated test circuitry, and can be performed on a finished packaged integrated circuit device in one aspect of the present application, or in a further aspect of the present application that includes additional alternative features, the novel test methods can be performed at the wafer level, as is described further below.

Figure 9:
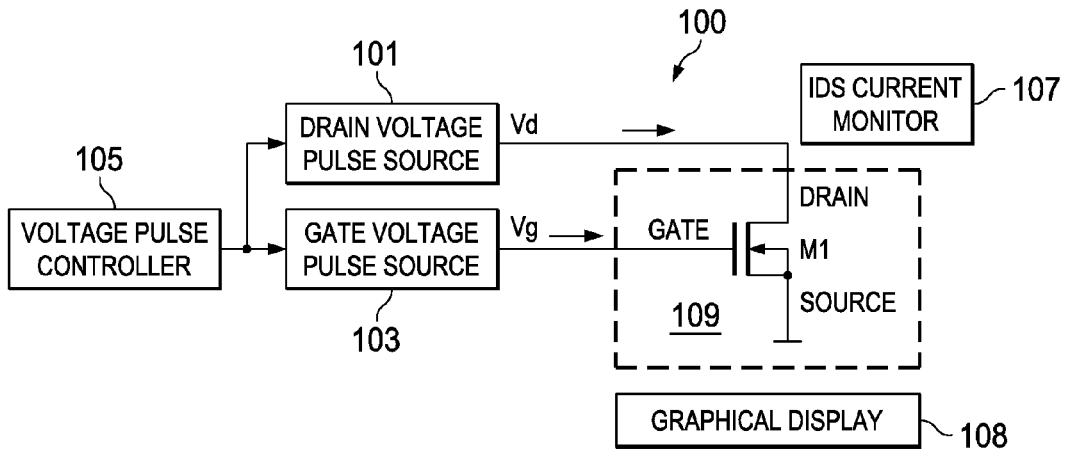
FIG. 9 depicts in a simplified circuit diagram an apparatus configured for use with additional aspects of the present application.

FIG. 9 depicts in a block diagram a system 100 for performing a particular test methodology that is another aspect of the present invention. In FIG. 9, the device under test is an HFET M1. This may be, for example, a GaAs or GaN or any other HFET device with a heterojunction in the channel. Block 109 indicates that the transistor M1 may be, for example, part of an integrated circuit under test, part of a packaged integrated circuit under test, or in another aspect of the present invention, transistor M1 may be one of many such devices formed on a semiconductor wafer, as is described further below.

In system 100, dual voltage pulse sources 101, 103 are coupled to provide the gate and drain voltage pulses used to quantify the HFET M1. A drain voltage pulse source 101 is shown coupled to the drain terminal of the HFET M1. A second voltage pulse source 103 provides gate voltage pulses to the gate terminal of the HFET M1. The source terminal is coupled to ground, as is conventionally done in integrated circuits. A voltage pulse controller 105, which can be implemented as software being executed on a programmable device such as a microcontroller, microprocessor, digital signal processor, mixed signal processor, ARM or RISC machine, or the like, is provided in system 100 and controls the dual voltage pulse generators 101, 103. In another alternative arrangement that is also contemplated by the inventors as an aspect of the present application, controller 105 can be implemented by a computer executing a program, i.e., a personal computer or PC, a workstation, or the like. A dedicated integrated circuit such as an ASIC, FPGA, CPLD, or custom integrated circuit can also be used as the controller 105 to form additional alternative arrangements that are also contemplated by the inventors and which fall within the scope of the appended claims. A current monitor 107 is provided to measure the current $I_{DS}$ into the drain terminal of the HFET M1. An optional feature that forms additional alternative arrangements that are also aspects of the present application is Graphical Display 108, which can visually display the measured drain currents vs. drain and gate voltages for the test conditions. The apparatus 100 of FIG. 9 can be used to create a variety of loadline conditions using the first and second pulse sources to create gate and drain voltage pulses with no overlap and with many differing overlap conditions.

Figure 10:
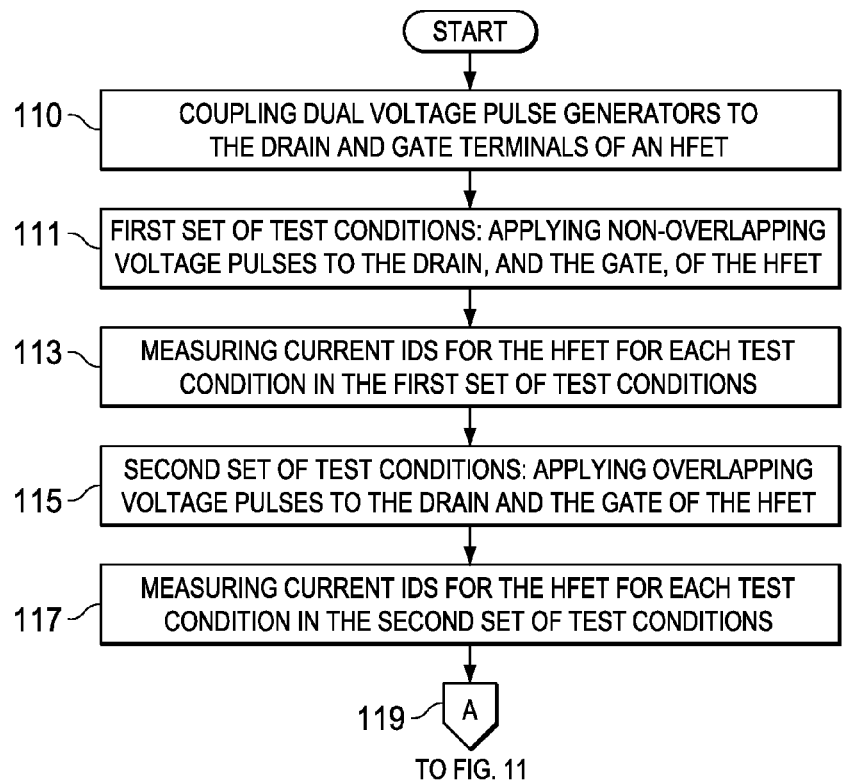
FIG. 10 illustrates in flow diagram an example test methodology incorporating various features of the present application.

FIG. 10 illustrates in a flow diagram a portion of an example novel test methodology that forms an aspect of the present application shown as a series of steps. In FIG. 10, the method begins at step 110 and begins by coupling dual voltage pulse generators to the drain and gate terminals of an HFET device under test. As discussed above the device under test can be an integrated circuit, a packaged integrated circuit, or one of many integrated circuits on a semiconductor wafer. In step 111, a first set of test conditions are performed. During step 111, the drain voltage generator is used to apply a voltage pulse to the drain terminal $V_D$ of the HFET. As the drain voltage pulse ends and the voltage VD falls, the voltage generator at the gate terminal is used to apply a voltage pulse to the gate of the HFET device. As discussed above, in performing the first set of test conditions, the drain voltage pulse and the gate voltage pulse do not overlap. At step 113, the drain current $I_{DS}$ is measured for each of the test conditions in the first set of test conditions. These test conditions correspond to the "soft switching" conditions for the HFET.

At step 115, a second set of test conditions are performed. In this set of test conditions, a voltage pulse is applied to the drain terminal of the HFET device, and while the voltage pulse is applied at the drain terminal, a voltage pulse is applied to the gate terminal so that when the HFET device is turned on, the voltage pulse at the drain terminal is still active, that is, the drain and gate voltage pulses overlap. In step 115, the dual voltage pulse generators can be used to create a wide variety of loadlines in the second set of test conditions with various ranges of overlap. In step 117, the current $I_{DS}$ is measured for each of the test conditions in the second set of test conditions. At step 119, the method continues onto the steps of FIG. 11.

Figure 11:
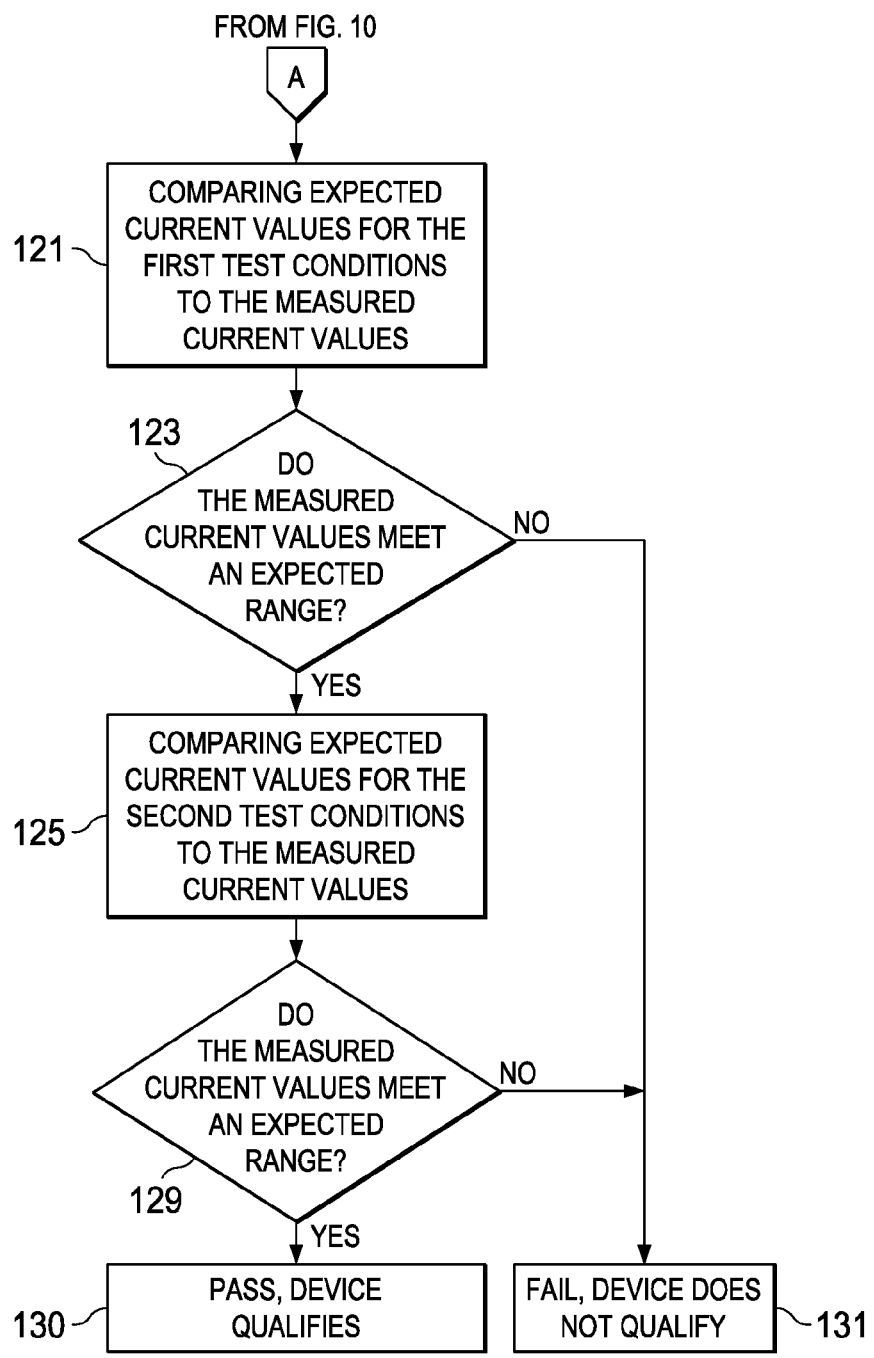
FIG. 11 illustrates in a flow diagram continuing steps of the novel test methodology of FIG. 10.

In FIG. 11, the method that began in FIG. 10 continues. At step 121, the method continues with a compare step. Expected current values are retrieved for the first set of test conditions, the soft switching test in this example arrangement, and are compared to the measured current values for the HFET device under test.

In step 123, a decision block is shown. If the measured current values fall within an expected range, the device passes the first test conditions and the method continues. If the current measured for the device fall outside the expected range, the device fails the first set of conditions and the method transitions to state 131.

In FIG. 11, if the HFET device passes the first set of conditions, a second compare is performed at step 125. In this comparison, expected current values for the second set of conditions are retrieved and compared to the measured current values for the HFET device. At step 129, a second decision is made. If the current measured for the HFET device under test fall within the expected range for the second set of test conditions, the device passes and is qualified, and the method transitions to state 130. If the device fails, the method transitions to step 131.

Various modifications to the methods illustrated in FIGS. 10 and 11 can be made and thereby create alternative arrangements that form additional aspects of the present application which are contemplated by the inventors. For example, the first set of test conditions and the second set of test conditions can be exchanged. Further, the compare steps and decision steps may be done in a different order. The compare steps can be combined. The decision steps can be combined. Each of these alternatives forms an additional arrangement that is contemplated as an aspect of the present application, and each falls within the scope of the appended claims.

FIG. 12 depicts in a simplified block diagram an apparatus 140 that provides a wafer scale test fixture for performing the novel methodologies of the present application. In FIG. 12, a voltage pulse generator 141 is provided and outputs a gate voltage pulse. A probe card 143 is shown in cross section and supports a gate wafer probe 145 that is coupled to the gate voltage pulse generator. A drain voltage pulse generator 147 is provided to generate the drain voltage pulses and is coupled to a drain wafer probe 149 that is also supported by wafer probe card 143.

A semiconductor wafer 151 that includes one or more HFET devices is shown on a support 153. In operation, the wafer probe card 143, or the wafer support 153, or both, are moved until the drain wafer probe 149 and the gate wafer probe 147 make contact with an HFET device on the semiconductor wafer 151. The movement is indicated by the vertical arrows in FIG. 12. Alignment apparatus such as microscopes or visual display equipment with magnification can be used to move the wafer in X and Y directions so as to place the wafer probes 145, 149 on the drain and gate terminals for an HFET device on wafer 151.

After the gate and drain wafer probes 145, 149 are placed in electrical contact with an HFET device on the wafer 151; the novel test methods described above can be performed on the HFET device. The soft switching operation, observed by performing the first set of test conditions, and the hard switching operation, observed by performing the second set of test conditions, can be performed for each HFET device on the semiconductor wafer 151. A plurality of integrated circuit dies each containing one or more HFET devices are formed on the semiconductor wafer 151. The wafer probes can be placed on each integrated circuit die and the novel tests described above can be performed using the gate and drain voltage generators and the wafer probes. Note that the use of the dual voltage pulse generators and the novel methodologies described as aspects of the present application are not to be limited to a wafer scale arrangement, and individual integrated circuit dies, or packaged integrated circuits, can also be tested and these arrangements form additional alternative arrangements that are discovered by and contemplated by the inventors as aspects of the present application and which fall within the scope of the appended claims.

FIG. 13 illustrates a semiconductor wafer 160 that illustrates another aspect of the present application. In FIG. 13, the individual integrated circuits shown as square portions have been qualified using the wafer probes of FIG. 12 and the novel test methodology of FIGS. 10 and 11 described above. In FIG. 13, the devices that failed to qualify are shown marked with a dot of ink. In an aspect of the present application, a semiconductor manufacturing process includes a known good die approach where the integrated circuits which fail to pass the qualification tests performed at a wafer probe station are marked. In the subsequent steps used to complete the integrated circuits, the packaging steps are not performed on the bad dies, so that the packages that are completed are said to contain only "known good" devices. Using a known good die approach avoids costly steps of packaging, wire bonding, ball bumping and so forth for dies that ultimately need to be scrapped, thus saving costs.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:
1. A test method, comprising:
coupling a gate pulse generator to a gate terminal of a power transistor device under test, coupling a drain pulse generator to a drain terminal of the power transistor device under test, and coupling a source terminal of the power transistor device under test to a ground potential;
coupling a current monitor to the drain terminal of the power transistor device under test;
for a first set of test conditions, activating the drain pulse generator for each of the test conditions to apply a voltage pulse to the drain terminal of the power transistor device under test, and for each of the test conditions, applying a voltage pulse to the gate terminal of the power transistor device from the gate pulse generator, the gate pulse rising only after the drain pulse falls below a predetermined threshold for each of the first set of test conditions;
for each of the first set of test conditions, measuring the drain current of the power transistor device under test with the drain current monitor;
for a second set of test conditions, activating the drain pulse generator and applying a voltage pulse to the drain terminal of the power transistor device under test, and applying a voltage pulse to the gate terminal of the power transistor device under test as the drain pulse falls for each of the second set of test conditions, the drain pulse generator and the gate pulse generator both being active for a portion of the second set of test conditions so that there is some overlap between the voltage pulse applied to the drain terminal and the voltage pulse applied to the gate terminal; and for each of the second set of test conditions, measuring the drain current into the power transistor device under test with the drain current monitor.

2. The method of claim 1, and further comprising:

storing the drain current measurements for the first set of test conditions, and storing the drain current measurements for the second set of test conditions; and comparing the stored drain current measurements to a set of predicted drain current measurements, and determining whether the drain current of the power transistor device under test is within a predetermined threshold of the predicted drain currents.

3. The method of claim 1, and further comprising:

indicating the power transistor device under test is a qualified device, responsive to the determining.

4. The method of claim 1, wherein the power transistor device under test further comprises a gallium arsenide (GaN) field effect transistor (FET).

5. The method of claim 4, wherein the GaN FET further comprises an AlGaN portion located in a channel region, a GaN portion formed over the AlGaN portion in the channel region, a gate dielectric layer formed over the GaN portion, and the gate terminal comprises a gate electrode formed over the gate dielectric.

6. The method of claim 1, wherein the power transistor device under test further comprises a gallium arsenide (GaAs) field effect transistor (FET).

7. The method of claim 6, wherein the GaAs FET further comprises an AlGaAs portion located in a channel region, a GaAs portion formed over the AlGaAs portion in the channel region, a gate dielectric layer formed over the GaAs portion, and the gate terminal comprises a gate electrode formed over the gate dielectric.

8. The method of claim 1, wherein the power transistor device is disposed within a packaged integrated circuit.

9. The method of claim 1, wherein the power transistor device under test is one of a plurality of power transistor devices disposed on a semiconductor wafer.

10. The method of claim 1, and further comprising:

outputting the measured drain currents to test equipment having a graphical display; and displaying the drain current plotted against the gate voltage and drain voltage, to depict load lines of the power transistor under test.

11. The method of claim 1, wherein the first set of test conditions further comprises activating the gate pulse generator to place a voltage pulse on the gate terminal, wherein the gate voltage varies between 0 Volts and a predetermined maximum magnitude, varying the gate voltage in steps for a plurality of test conditions.

12. The method of claim 11, wherein the second set of test conditions further comprises activating the gate pulse generator to place a voltage pulse on the gate terminal overlapping the voltage pulse on the drain terminal, and for each of a plurality of test conditions, the voltage pulse applied to the gate terminal varies from 0 Volts to a maximum voltage magnitude in predetermined steps.

13. A method for manufacturing power FET devices, comprising:

providing a semiconductor wafer comprising a plurality of integrated circuits formed thereon, each of the integrated circuits having at least one power FET device comprising a high electron mobility transistor (HEMT) having a gate, a drain and a source terminal;

providing a probe card having conductive probes configured to electrically contact the gate, drain and source terminals of the at least one power FET device on one or more of the integrated circuits on the semiconductor wafer, and placing the probe card proximate to and in alignment with the semiconductor wafer;

moving at least one of the semiconductor wafer and the probe card to establish electrical contact between ends of the conductive probes and the semiconductor wafer;

coupling a gate pulse generator to a probe that is in electrical contact with a gate terminal of the power FET device on the semiconductor wafer, coupling a drain pulse generator to a probe that is in electrical contact with the drain terminal of the power FET device and coupling a ground potential to a probe that is in electrical contact with the source terminal of the power FET device;

for a first set of test conditions, activating the drain pulse generator and applying a voltage pulse to the drain terminal of the power FET, and for each of the first set of test conditions, activating the gate pulse generator and applying a voltage pulse to the gate terminal of the power FET, the gate pulse rising only after the drain pulse falls to a predetermined low voltage for each test condition so the gate and drain voltage pulses never overlap;

for each of the first set of test conditions, measuring the drain current of the power FET device with a drain current monitor;

for a second set of test conditions, activating the drain pulse generator and applying a voltage pulse to the drain terminal of the power FET, and activating the gate pulse generator and applying a voltage pulse to the gate terminal of the power FET as the drain pulse falls for each of the second set of test conditions, the drain pulse generator and the gate pulse generator both being active for a portion of each of the second set of test conditions, so that there is some overlap between the voltage pulse applied to the drain terminal and the voltage pulse applied to the gate terminal; and for each of the second set of test conditions, measuring the drain current into the power FET with the drain current monitor.

14. The method of claim 13, wherein each of the power FET devices further comprises one selected from the group consisting essentially of a gallium nitride heterojunction FET transistor and a gallium arsenide heterojunction FET transistor.

15. The method of claim 13, and further comprising:

storing the drain current measurements for the first set of test conditions, and storing the drain current measurements for the second set of test conditions; and comparing the stored drain current measurements to a set of predicted drain current measurements, and determining whether the drain current for the power FET is within a predetermined threshold of the predicted drain currents.

16. The method of claim 15, and further comprising:

indicating a power FET on the semiconductor wafer is a qualified device, responsive to the determining.

17. The method of claim 15, and further comprising indicating a power FET on the semiconductor wafer is not a qualified device and marking the corresponding integrated circuit die on the semiconductor wafer with a machine visible marking.

18. The method of claim 17, and further comprising singulating the semiconductor wafer into separated integrated circuit dies, and packaging the separated integrated circuit dies that are unmarked.

19. An apparatus, comprising:
a first pulse generator configured to generate gate terminal pulses for testing a power FET device under test;
a second pulse generator configured to generate drain terminal pulses for testing the power FET device under test;
a drain current monitor for measuring the drain current of the power FET device under test; and
a controller coupled to the first pulse generator and the second pulse generator for enabling a gate voltage pulse from the first pulse generator and a drain voltage pulse from the second pulse generator;
wherein the controller is configured to perform a first set of test conditions corresponding to a soft switching condition where for each test in the first set of test conditions, a drain voltage pulse is output from the second pulse generator, and as the drain pulse falls below a predetermined voltage, a gate voltage pulse is output from the first pulse generator, so that the drain voltage pulse and the gate voltage pulse never overlap, and the controller is further configured to perform a set of second test conditions corresponding to a hard switching condition where, for each test in the second set of test conditions, a drain voltage pulse is output from the second pulse generator, and a gate voltage is output from the first pulse generator as the drain pulse falls, to that for a portion of each test in the second set of test conditions, the gate voltage pulse and the drain voltage pulse overlap.

20. The apparatus of claim 19, and further comprising:
a wafer probe card having at least one gate probe coupled to the first pulse generator and configured to supply the gate voltage pulses to a gate terminal of a power FET device disposed on a semiconductor wafer, and having at least one drain probe coupled to the second pulse generator and configured to supply the drain voltage pulses to the drain terminal of a power FET device disposed on the semiconductor wafer, and configured to supply a ground potential to a source terminal of the power FET device disposed on the semiconductor wafer.

* * * * *